United States Patent [19]

Nakashima

[11] Patent Number: 4,897,648

[45] Date of Patent: Jan. 30, 1990

[54] ANALOG-TO-DIGITAL CONVERTER HAVING A GRAY CODE BOARD WITH THE LEAST SIGNIFICANT BIT PATTERN DISPOSED IN THE CENTER

[75] Inventor: Shigeo Nakashima, Kanagawa, Japan

[73] Assignee: Canon Kabushiki Kaisha, Tokyo, Japan

[21] Appl. No.: 139,973

[22] Filed: Dec. 31, 1987

[30] Foreign Application Priority Data

Jan. 12, 1987 [JP] Japan ............................ 62-2614[U]

[51] Int. Cl.$^4$ ............................................ H03M 1/22
[52] U.S. Cl. ............................................ 341/16; 341/1
[58] Field of Search ...................... 340/347 P, 347 M; 250/231 SE; 341/13, 16, 17, 1, 6, 11, 97; 354/289.1

[56] References Cited

U.S. PATENT DOCUMENTS 3,003,142 10/1961 Wolinsky ........................ 340/347 P
3,500,382 3/1970 Rochette .............................. 341/16
3,902,063 8/1975 Oelsch et al. ............. 250/231 SE X
4,639,108 1/1987 Sakai et al. ........................ 354/289.1

OTHER PUBLICATIONS

The Engineering Staff of Analog Devices, Inc., Analog–Digital Conversion Handbook, 6/1972, pp. II-13 to II-16.

Primary Examiner—William M. Shoop, Jr.
Assistant Examiner—Brian K. Young
Attorney, Agent, or Firm—Fitzpatrick, Cella, Harper & Scinto

[57] ABSTRACT

An analog-to-digital converter apparatus has a code board having at least three patterns disposed thereon. One of the patterns represents a least significant bit and is arranged at the center between the other patterns. A reading device is provided for reading the patterns on the code board and for outputting a digital signal corresponding to the patterns. By arranging the least significant pattern in the center, adjustments between the reading device and the code board are not critical, and reading accuracy is improved.

10 Claims, 5 Drawing Sheets

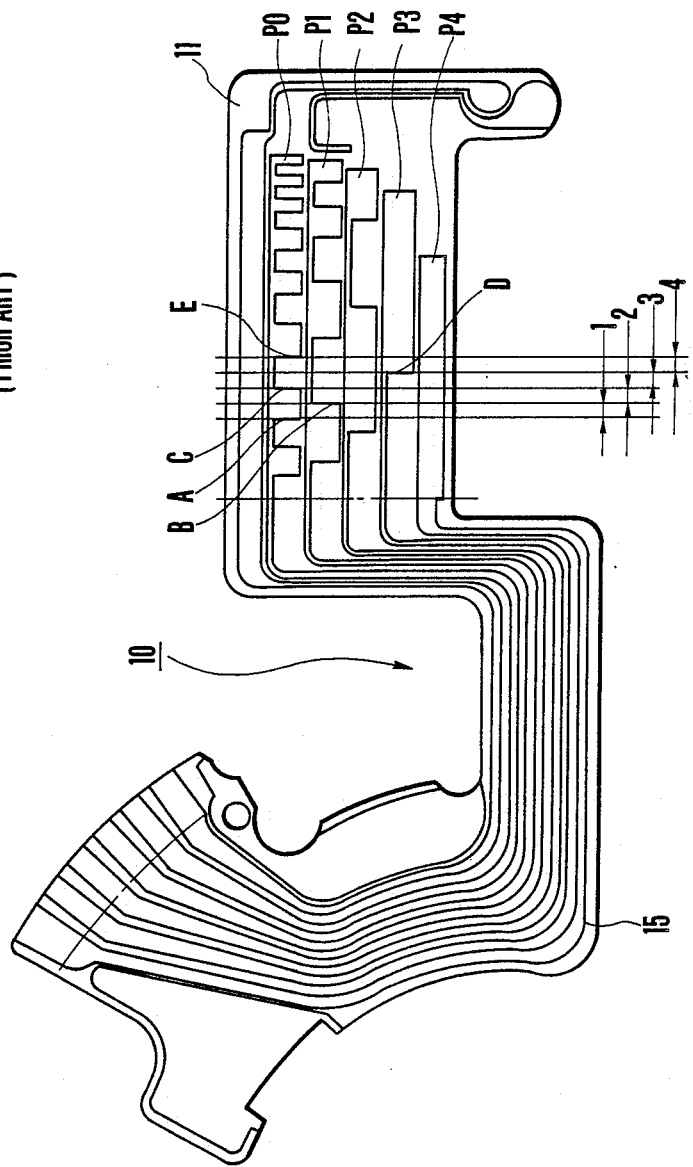

ANALOG-TO-DIGITAL CONVERTER HAVING A GRAY CODE BOARD WITH THE LEAST SIGNIFICANT BIT PATTERN DISPOSED IN THE CENTER

BACKGROUND OF THE INVENTION

1. Field of the Invention

This invention relates to code boards and, more particularly, to a code board having formed on one surface thereof a number of Gray code patterns being scanned by respective brushes or like reader members to give off a digital signal whose bits correspond to the patterns and alternate between two logic values.

2. Description of the Related Art

To convert analog input data into its equivalent digital form, there have been many previous proposals for utilizing a code board having Gray code patterns or the like in combination with a reader in the form of a brush for reading information representing the position of an object, as, for example, in U.S. Pat. No. 4,639,108 and Japanese Laid-Open Patent Application No. Sho 58-125188.

FIG. 3 illustrates a conventional code board 11 having a Gray code pattern portion composed of a plurality of electrically conductive and non-conductive patterns constituting part of the flexible printed circuit board 10. The Gray code pattern portion on the code board 11 is formed in five patterns P0, P1, P2, P3 and P4 from which respective bits of a digital signal are generated. The number of transitions over the entire length of each pattern becomes progressively smaller from the upper to the lower pattern or in the order of patterns P0, P1, P2, P3, P4. To read such a Gray code pattern portion, five sliders or brushes of a reader 12 are brought into registry with the respective patterns, as shown in FIG. 2(A).

In connection with each monotonic zone, a phenomenon takes place in reading the gray code pattern portion of FIG. 3 which is explained below. As the reader 12 moves rightward, a first zone 1 is partitioned by a transition line A in the Gray code pattern P0 and a transition line B in the Gray code pattern P1, a second zone 2 by the transition line B in the pattern P1 and the next transition line C in the pattern P0, a third zone 3 by the transition line C in the pattern P0 and a transition line D in the Gray code pattern P3, and a fourth zone 4 by the transition line D in the pattern P3 and the next transition line E in the pattern P0.

In such a manner, any of the monotonic zones is made to lie between one of the transition lines of the Gray code pattern P0 and one of the transition lines of the other patterns P1 to P4.

In order to read the Gray code patterns accurately with a given resolution, the perpendicularity of a line passing through the points at which the tips 12a of the brushes of the reader 12 come into contact with the Gray code patterns to the path of movement of the reader 12 must be sufficient so as to fall within the width of the monotonic zone.

In actual practice, however, the line of contact will be erroneously declined from the direction of the transition line to some angle, $\theta$, as shown in FIG. 2(A). In the same figure, 13 is a fastener screw for the reader 12, and 14 is a location pin.

FIG. 2(B) is a fragmentary view in exaggerated scale of parts of the Gray code pattern portion and the reader 12 of FIG. 2(A) which are near the tips 12a of the brushes across the Gray code patterns P0 to P4.

Now, as shown in FIG. 2(B), let the width of the same code zone in which the read values from the Gray code patterns are identical as the reader 12 moves, be denoted by $l_1$; the position of the tip 12a of the first brush which traces the transition lines in the Gray code pattern P0 be denoted by X1; the position of the tip 12a of another brush which traces the transition lines in the Gray code pattern Pn ($n \geq 1$) be denoted by Xn; the angle of inclination of the reader 12 with the transition line of the Gray code pattern be denoted by $\theta_1$; and the tolerance for the relative positions of the tips 12a of the brushes to the common design line be denoted by 1. The read error $d_1$ due to the inclination $\theta_1$ of the reader 12 with the transition line of the Gray code pattern is given by the following expression:

$$d_1 = |\overline{X1 \cdot Xn}| \cdot \tan \theta_1 \tag{1}$$

Hence, in order to convert the analog input data to digital form accurately with the desired resolution, it is required that the width $l_1$ falls within the following range:

$$l_1 > \Delta 1 + d_1$$

that is, $$l_1 > \Delta_1 + |\overline{X1 \cdot Xn}| \cdot \tan \theta_1 \tag{2}$$

However, in actual practice, it is very difficult to set up an operating mechanism so that the reader 12 runs over the code board while its path of movement is maintained exactly perpendicular to the transition lines, or at $\theta_1 = 0$. For this reason, the read error tends to be unavoidable.

SUMMARY OF THE INVENTION

It is, therefore, an object of the invention to provide a code board having a plurality of Gray code patterns whose layout is improved so that even when the tips of the brushes of a reader scan the respective Gray code patterns under such a condition that the contact line of the tips is not exactly parallel to but is slightly inclined with the transition line of the Gray code patterns, a highly accurate reading is made possible as the read error is reduced.

BRIEF DESCRIPTION OF THE DRAWINGS

FIG. 3 is a top view of the conventional Gray code pattern layout on a flexible printed circuit board.

DETAILED DESCRIPTION OF THE PREFERRED EMBODIMENT

Figure 1:
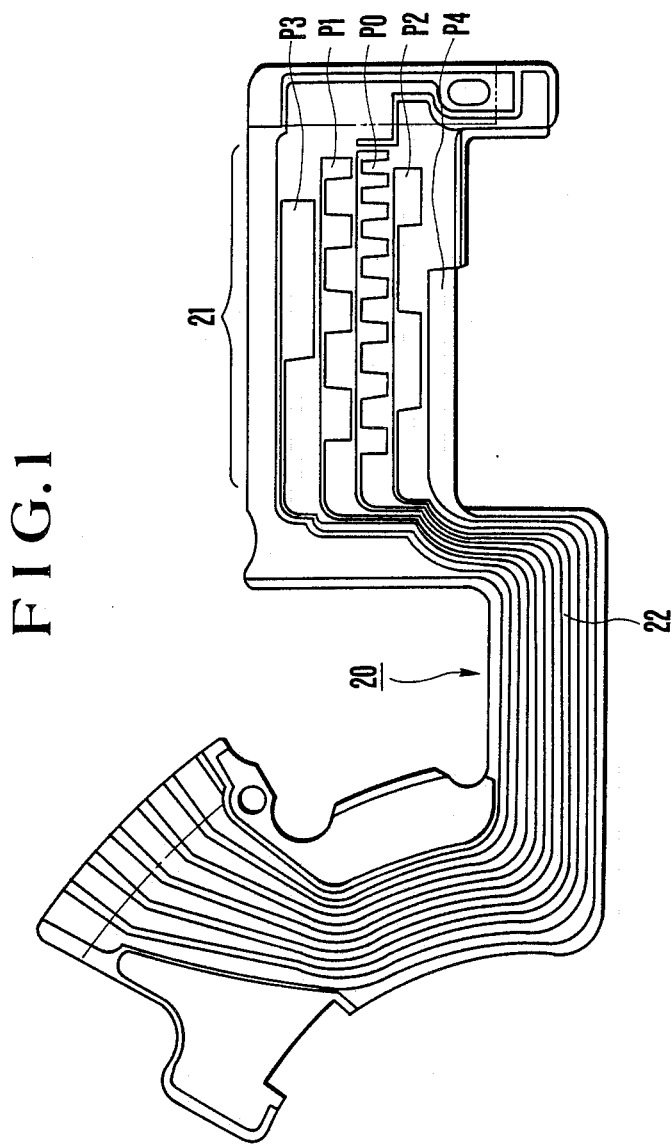
FIG. 1 is a top view of an embodiment of a code board according to the invention as constituting part of a flexible printed circuit board.

In FIG. 1, there is shown an embodiment of the invention, where a flexible printed circuit board 20 is included with the code board 21 of the invention. A plurality of, in this instance, five, Gray code patterns P0, P1, P2, P3 and P4 in the code board 21 have respective leads 22 terminating at interconnection patches. The number of transition lines across which the bit signal changes between two logic values in each of the patterns P0, P1, P2, P3 and P4 becomes progressively smaller in this order.

In this embodiment, of the plurality of patterns, the pattern P0 which corresponds to the least significant bit is positioned at the center of the width of the board 21. Spread outwardly therefrom are the other or higher-bit patterns P1, P2, P3 and P4 of progressively smaller numbers of transition lines alternately on either side of the pattern P0. Accordingly, the pattern P4 which makes up the most significant bit signal takes the uppermost position of the code board 21.

By employing such a layout in this embodiment, the deviation of the contact line of the tips of the brushes of the reader from being parallel with the transition line is small, and a smaller read error than in the prior art is achieved.

Figure 2A:
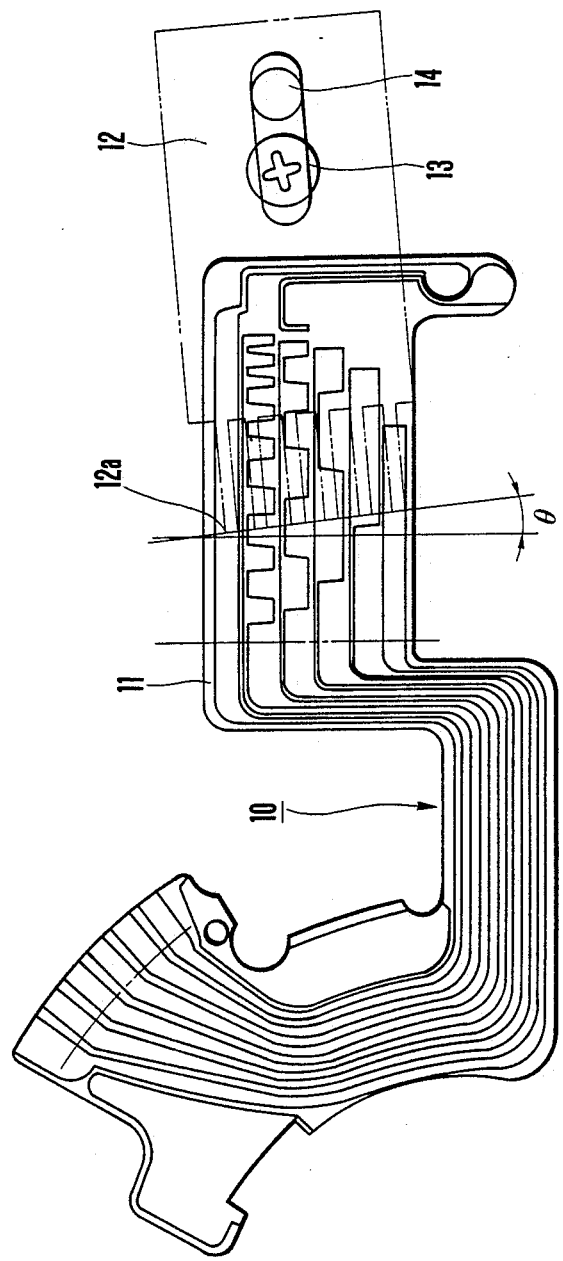
FIG. 2(A) is a top view illustrating the relationship of the code board and the reader therefor.

Next, the relative accuracy between such a set of the patterns P0 to P4 of the invention and the reader is explained by reference to FIG. 2(C).

Figure 2B:
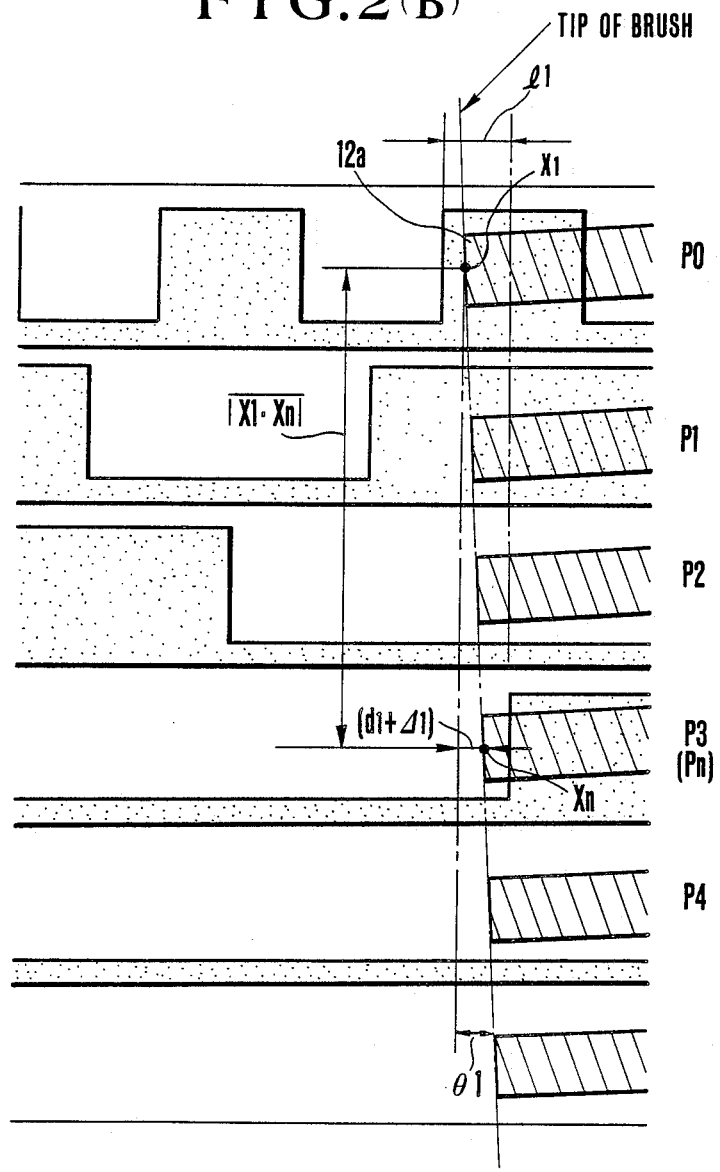
FIGS. 2(B) and 2(C) are diagrams for explaining the read error when the Gray code patterns are read by the reader.
Figure 2C:
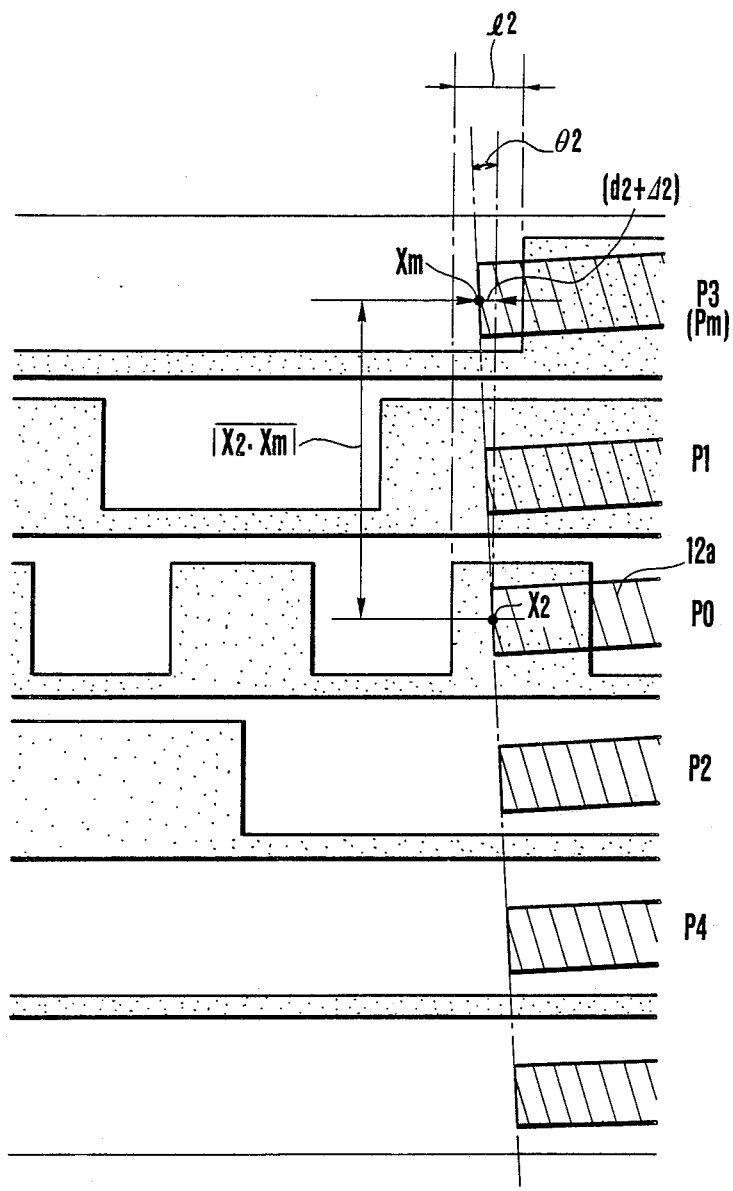

Similar to the conventional example of FIG. 2(B), the width of the same code zone in which read values from the Gray code patterns are identical is denoted by $l_2$; the position of the tip 12a of the brush which traces the transition lines in the pattern P0 is denoted by $X_2$; the position of the tip 12a of another brush which traces the transition lines in the pattern Pm ($m \geq 1$) is denoted by $X_m$; the angle of inclination of the reader 12 with the transition line in the Gray code pattern is denoted by $\theta_2$; and the tolerance for the relative positions of the tips 12a of the brushes to the common design line is denoted by $\Delta_2$.

With this, the equation for the read error $D_2$ in terms of the angle of inclination $\theta_2$ becomes $$d_2 = |\overline{X2 \cdot Xm}| \cdot \tan \theta_2 \quad (3)$$

Hence, for this case, in order to read the signal without error, the width $l_2$ is required to fall in the following range:

$$l_2 > \Delta_2 + d_2$$

that is, $$l_2 > \Delta_2 + |\overline{X2 \cdot Xm}| \cdot \tan \theta_2 \quad (4)$$

Now assuming that, for the purpose of comparing the conventional example of FIG. 3 with the embodiment of the invention shown in FIG. 1, the widths $l_1$ and $l_2$ are equal to each other, and the tolerances $\Delta_1$ and $\Delta_2$ of the positions of the tips of the brushes are also equal to each other, that is, $$l_1 = l_2; \; \Delta_1 = \Delta_2$$

then the condition under which the Gray code patterns can be read within the given resolution is found as follows:
From the inequality (2), $$l_1 - \Delta_1 > d_1 = |\overline{X1 \cdot Xn}| \cdot \tan \theta_1 \quad (5)$$

From the inequality (4), $$l_2 - \Delta_2 = l_1 - \Delta_1 > d_2 = |\overline{X2 \cdot Xm}| \cdot \tan \theta_2 \quad (6)$$

Thus, the read accuracy differs with the different values of $|\overline{X1 \cdot Xn}| \cdot \tan \theta_1$ and $|\overline{X2 \cdot Xm}| \cdot \tan \theta_2$.

Since, in the invention, the pattern P0 is positioned nearly at the center of the array of the plurality of patterns, the value of the position X2 corresponds to about the center of the reader.

Differing from this, according to the prior art, the pattern P0 is at the extreme side of the array of the patterns, the value of the position X1 corresponds to about the vicinity of the reader. Therefore, $$\text{MAX}|\overline{X1 \cdot Xn}| > \text{Max}|\overline{X2 \cdot Xm}| \quad (7)$$

From this $$\text{MAX } \theta_1 < \text{MAX } \theta_2 \quad (8)$$

is obtained. Here, suppose, for example, $\theta_1 = \theta_2$, then $$\text{Max } \Delta_1 < \text{MAX } \Delta_2 \quad (9)$$

Again, suppose $\theta_1 = \theta_2$, $\Delta_1 = \Delta_2$, then $$l_1 > l_2 \quad (10)$$

As is apparent from the above, when, as in the invention, the one of the plurality of patterns which has the largest number of transition lines is positioned nearly at the center, and the other patterns take their places at farther positions therefrom as the number of transition lines decreases, it is made possible to read the Gray code patterns with a higher accuracy than in the prior art.

For example, as will be seen from the inequality (7), the read error is decreased. Also, despite the fact that the angular deviation of the tip of the reader from the transition line is larger than that of the conventional example, an equivalent accuracy can be effected when reading.

Incidentally, though this embodiment has been described in connection with linear patterns, it is to be understood that the present invention is applicable to a concentric array of patterns. Even in this case, a similar advantage can be produced.

Though, in the embodiment shown in FIG. 1, the patterns P3, P1, P0, P2 and P4 are positioned in this order from the upper side to the lower side of the board 21 as viewed in FIG. 1, this order may be reversed to P4, P1, P0, P2 and P3.

Incidentally, even in this embodiment, the position of the brushes of the reader 12 is adjusted by moving it in a direction parallel to the Gray code patterns likewise as in the case of FIG. 2(A).

According to the invention, a plurality of Gray code patterns are arrayed in the way described above, thereby the relative accuracy due to the erroneous orientation of the the reader and the gaps of the tips of the reader from a common line can be prevented from lowering and rising respectively. Thus, a code board of increased resolution which still permits the code to be read with a high accuracy can be achieved. In turn, it is made easier to reduce the phase error between the Gray code patterns and the reader, and to establish the desired orientation of the reader.

What is claimed is:
1. An analog to digital converter, comprising:
   code board means comprising a Gray code pattern structure having at least three linearly-extending patterns arranged in substantially parallel rows disposed thereon, one of said three patterns which has a largest number of transition lines being arranged at a center portion of said patterns, and other patterns having smaller numbers of transition lines being arranged at positions outward from the center; and reading means for reading said Gray code pattern structure and providing a digital output signal corresponding to said patterns.

2. A converter according to claim 1, wherein a transition line of one of said patterns is set in a position between the transition lines of the adjacent patterns.

3. A code detecting device comprising:

a code board including a Gray code pattern structure having at least three linearly-extending patterns arranged in substantially parallel rows disposed thereon, one of said three patterns on said code board which has a largest number of transition lines being arranged at a center portion of said patterns, and other patterns having smaller numbers of transition lines being arranged at positions outward from the center;

a reader arranged to move over said Gray code pattern structure of said code board, said reader being provided with a plurality of means for reading said patterns; and adjusting means for adjusting positions of said plurality of reading means, said adjusting means moving each of said plurality of reading means in a direction parallel to an extending direction of said patterns.

4. Analog-to-digital converter apparatus comprising:

code board means having at least three linearly-extending patterns arranged in substantially parallel rows disposed thereon, one of said patterns representing a least significant bit and being arranged at a center portion between the other patterns; and reading means for reading the patterns on said code board means, and for outputting a digital signal corresponding to said patterns.

5. Apparatus according to claim 4, wherein another of said patterns represents a most significant bit and is arranged at an edge of said plurality of patterns.

6. An analog-to-digital converter, comprising:

code board means comprising a Gray code pattern structure having a plurality of concentrically-arranged patterns disposed thereon, one of said patterns which has a largest number of transition lines being arranged at a center portion of said patterns, and other patterns having smaller numbers of transition lines being arranged at positions outward from the center; and reading means for reading said Gray code pattern structure and providing a digital output signal corresponding to said patterns.

7. A converter according to claim 6, wherein any given transition line of one of said patterns is set in a position between the transition lines of the adjacent patterns.

8. A code detecting device comprising:

a code board including a Gray code pattern structure having a plurality of concentrically-arranged patterns disposed thereon, one of said patterns on said code board which has a largest number of transition lines being arranged at a center portion of said patterns, and other patterns having smaller numbers of transition lines being arranged at positions outward from the center;

a reader arranged to move over said Gray code pattern structure of said code board, said reader being provided with a plurality of means for reading said patterns; and adjusting means for adjusting positions of said plurality of reading means, said adjusting means moving each of said plurality of reading means over said patterns.

9. Analog-to-digital converter apparatus, comprising:

code boards means having a plurality of concentrically-arranged patterns disposed thereon, one of said patterns representing a least significant bit and being arranged at a center portion between the other patterns; and reading means for reading the patterns on said code board means, and for outputting a digital signal corresponding to said patterns.

10. Apparatus according to claim 9, wherein another of said patterns represents a most significant bit and is arranged at an edge of said plurality of patterns.

* * * * *

UNITED STATES PATENT AND TRADEMARK OFFICE
CERTIFICATE OF CORRECTION

PATENT NO. : 4,897,648

DATED : January 30, 1990

INVENTOR(S) : Shigeo Nakashima

It is certified that error appears in the above-identified patent and that said Letters Patent is hereby corrected as shown below:

COLUMN 4:

Line 61, "made" should be deleted.

Line 65, "analog to digital converter," should read --analog-to-digital converter,--.

COLUMN 6:

Line 34, "code boards means" should read --code board means--.

Signed and Sealed this

Twenty-sixth Day of March, 1991

Attest:

HARRY F. MANBECK, JR.

*Attesting Officer*      *Commissioner of Patents and Trademarks*